(12) United States Patent
Zhang et al.

(10) Patent No.: US 10,998,345 B2
(45) Date of Patent: May 4, 2021

(54) DISPLAY PANEL AND DISPLAY DEVICE

(71) Applicant: Shanghai Tianma AM-OLED Co., Ltd., Shanghai (CN)

(72) Inventors: Mengmeng Zhang, Shanghai (CN); Xingyao Zhou, Shanghai (CN); Yue Li, Shanghai (CN); Shuai Yang, Shanghai (CN)

(73) Assignee: Shanghai Tianma AM-OLED Co., Ltd., Shanghai (CN)

( * ) Notice: Subject to any disclaimer, the term of this patent is extended or adjusted under 35 U.S.C. 154(b) by 29 days.

(21) Appl. No.: 16/681,450

(22) Filed: Nov. 12, 2019

(65) Prior Publication Data
US 2020/0411558 A1 Dec. 31, 2020

(30) Foreign Application Priority Data
Jun. 28, 2019 (CN) .............................. 201910579045

(51) Int. Cl.
*H01L 27/12* (2006.01)
*H01L 27/32* (2006.01)
*G09G 3/20* (2006.01)

(52) U.S. Cl.
CPC ........ *H01L 27/124* (2013.01); *H01L 27/1255* (2013.01); *H01L 27/3211* (2013.01); *H01L 27/3276* (2013.01)

(58) Field of Classification Search
CPC ............... H01L 27/124; H01L 27/1255; H01L 27/3218; H01L 27/3276
See application file for complete search history.

(56) References Cited

U.S. PATENT DOCUMENTS

2018/0130856 A1* 5/2018 Kim .................... H01L 27/3218

FOREIGN PATENT DOCUMENTS

CN 109585519 A 4/2019

* cited by examiner

*Primary Examiner* — Marcos D. Pizarro
*Assistant Examiner* — Antonio B Crite
(74) *Attorney, Agent, or Firm* — Christensen O'Connor Johnson Kindess PLLC

(57) ABSTRACT

The present disclosure provides a display panel. The display panel includes: data lines located in the display area, arranged in a first direction, extending in a second direction, and including first and second data lines, and a cross-voltage range of the first data line being smaller than that of the second data line; and fanout traces located in the fanout area and including first and second fanout traces located between first and second edges, and the first fanout trace being connected to the first data line and the second fanout trace being connected to the second data line. A length of the first edge is longer than a length of the second edge, the first edge and the second edge are oppositely arranged in the second direction, and a line width d1 of the first fanout trace is smaller than a line width d2 of the second fanout trace.

16 Claims, 5 Drawing Sheets

US 10,998,345 B2

DISPLAY PANEL AND DISPLAY DEVICE

CROSS-REFERENCE TO RELATED APPLICATIONS

The present disclosure claims priority under 35 U.S.C. § 119 to Chinese Patent Application No. 201910579045.1, filed on Jun. 28, 2019, the content of which is incorporated herein by reference in its entirety.

TECHNICAL FIELD

The present disclosure relates to the technical field of display technologies, and in particular, to a display panel and a display device.

BACKGROUND

At present, with development of display technologies, there is an increasing demand on an appearance dimension of a display screen. For mobile display products such as cellphones, there are more requirements such as a narrow bezel and a high screen occupancy ratio. In other words, a dimension of a non-display area located in a periphery of a display area of the display panel is expected to be smaller and smaller.

However, the large number of traces that need to be provided in the non-display area works against reduction of the dimension of the non-display area, thereby limiting the increase of the screen occupancy ratio of the display panel.

SUMMARY

The present disclosure provides a display panel and a display device, in which a size of a non-display area of the display panel is decreased and a screen occupancy ratio of the display panel is improved.

In an aspect, an embodiment of the present disclosure provides a display panel. The display panel has a display area and a fanout area including a first edge close to the display area and a second edge facing away from the display area. The display panel includes: a plurality of data lines located in the display area and a plurality of fanout traces located in the fanout area. The plurality of data lines is arranged in a first direction and extends in a second direction. The plurality of data lines includes a first data line and a second data line. A cross-voltage range of the first data line is smaller than a cross-voltage range of the second data line. The plurality of fanout traces includes at least one first fanout trace and at least one second fanout trace that are located between the first edge and the second edge, and the at least one first fanout trace are connected to the first data line and the at least one second fanout trace are connected to the second data line. A length of the first edge is longer than a length of the second edge, the first edge and the second edge are oppositely arranged in the second direction, and a line width d1 of each of the at least one first fanout trace is smaller than a line width d2 of each of the at least one the second fanout trace.

In another aspect, an embodiment of the present disclosure provides a display device including the above-mentioned display panel.

BRIEF DESCRIPTION OF DRAWINGS

In order to more clearly illustrate technical solutions in embodiments of the present disclosure, the accompanying drawings used in the embodiments are briefly introduced as follows. It should be noted that the drawings described as follows are merely part of the embodiments of the present disclosure, other drawings can also be acquired by those skilled in the art without paying creative efforts.

DESCRIPTION OF EMBODIMENTS

For better illustrating technical solutions of the present disclosure, embodiments of the present disclosure will be described in detail as follows with reference to the accompanying drawings.

It should be noted that, the described embodiments are merely exemplary embodiments of the present disclosure, which shall not be interpreted as limiting the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing, individually. In addition, the character "/" herein generally indicates that the related objects before and after the character form an "or" relationship.

It should be understood that although the fanout trace may be described using the terms of "first", "second", etc., in the embodiments of the present disclosure, the fallout trace will not be limited to these terms. These terms are merely used to distinguish fallout traces from one another. For example, without departing from the scope of the embodiments of the present disclosure, a first fanout trace may also be referred to as a second fanout trace, and similarly, a second fanout trace may also be referred to as a first fanout trace.

Figure 1:
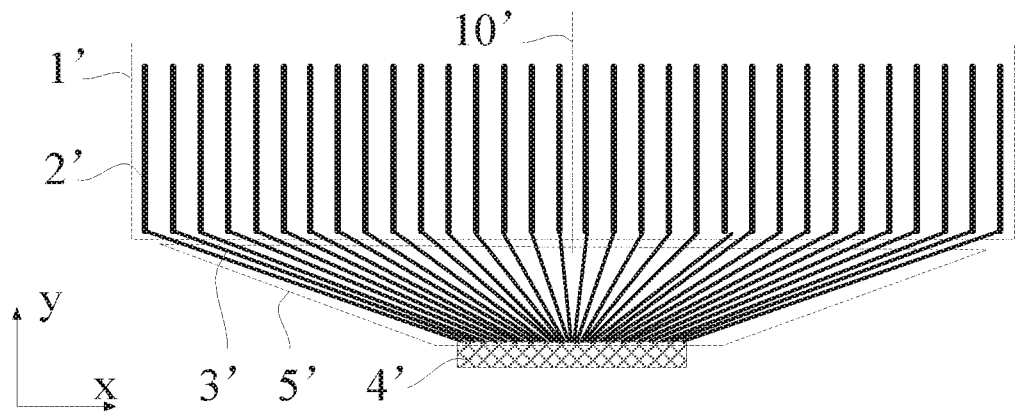
FIG. 1 is a schematic diagram of a lower bezel of a display panel in the related art.

FIG. 1 is a schematic diagram of a lower bezel of a display panel in the related art. As shown in FIG. 1, connection lines 3' need to be provided so as to connect a plurality of data lines 2' located in a display area 1' with a driving chip 4', and an area where the connection line 3' is located is called a fanout area 5'. Generally, a length of the driving chip 4' in a first direction x is much smaller than a length of the display area 1' in the first direction x. Thus, the connection lines 3', except for those connecting data lines 2' close to a center line 10' of the display area 1' with the driving chip 4', each have a significant inclination angle.

As shown in FIG. 1, a center of the driving chip 4' is generally arranged correspondingly to the center line 10' of the display area 1'. Moreover, after a resolution of the display panel is determined, the number and positions of the data lines 2' and pins on the driving chip 4' generally do not change. Therefore, in some embodiments, in order to prevent two adjacent connection lines 3' from overlapping, the fanout area 5' may not be designed to have an extremely small height.

Figure 2:
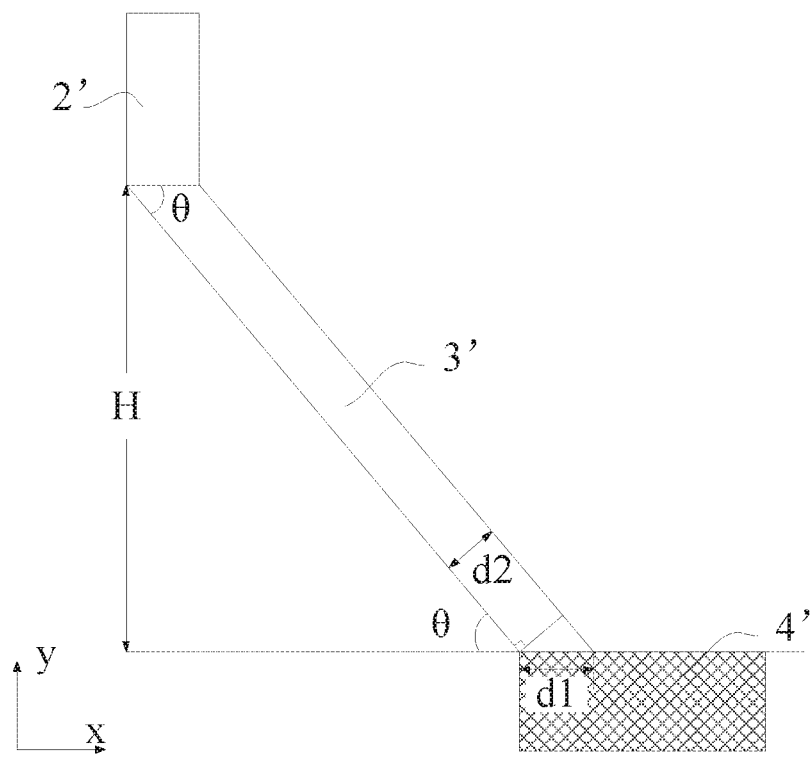
FIG. 2 is an enlarged schematic diagram of a connection line connecting one data line with a driving chip in FIG. 1.

FIG. 2 is an enlarged schematic diagram of a connection line 3' connecting one data line 2' and a driving chip 4' in FIG. 1. As shown in FIG. 2, the connection line 3' has an inclination angle of θ and a line width of d2. The connection line 3' has a binding width of d1 on the driving chip 4'. Here, a line width of the data line 2' and the line width of the connection line 3' are respective radial sizes. For the connection line 3', the inclination angle θ, the line width d2 and the binding width d1 satisfy:

$$d2=d1 \sin \theta \tag{1}.$$

If the height H of the fanout area 5' is decreased, since the positions of the data lines 2' and the pins on the driving chip 4' do not change, the inclination angle θ of the connection line 3' will become smaller. In a case where the line width d2 of the connection line 3' is constant, the binding width d1 will increase. Due to a limited space of the fanout area 5', the larger binding width d1 will decrease a space between two adjacent connection lines 3', resulting in an increased interference between the two adjacent connection lines 3'. In this case, normal display of the display panel will be affected. Therefore, in the related art, it is necessary to set the height H of the fanout area 5' to be large, which is disadvantageous for a narrow bezel design of the display panel.

Figure 3:
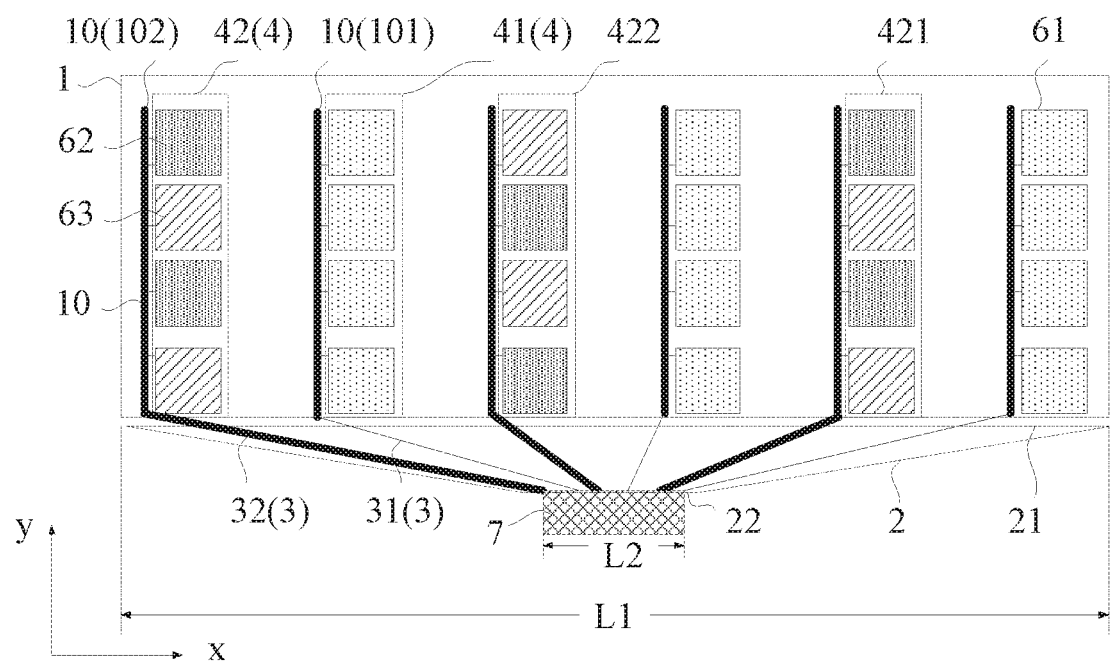
FIG. 3 is a schematic diagram of a display panel according to an embodiment of the present disclosure.

In view of this, an embodiment of the present disclosure provides a display panel. FIG. 3 is a schematic diagram of a display panel according to an embodiment of the present disclosure. As shown in FIG. 3, the display panel includes a display area 1 and a fanout area 2. The display area 1 is provided with a plurality of data lines 10 arranged in the first direction x and extending in a second direction y. The data lines 10 include a first data line 101 and a second data line 102. A cross-voltage range of the first data line 101 is smaller than a cross-voltage range of the second data line 102.

As shown in FIG. 3, the fanout area 2 includes a first edge 21 and a second edge 22 that are oppositely arranged in the second direction y. The first edge 21 is an edge of the fanout area 2 close to the display area 1, and the second edge 22 is an edge of the fanout area 2 facing away from the display area 1. A length L1 of the first edge 21 is larger than a length L2 of the second edge 22. That is, the fanout area 2 is shaped as an inverted trapezoid with a long upper side and a short lower side.

The fanout area 2 is provided with a plurality of fallout traces 3 including a first fanout trace 31 and a second fanout trace 32. The first fanout trace 31 and the second fanout trace 32 are located between the first edge 21 and the second edge 22. The first fanout trace 31 is connected to the first data line 101, and the second fanout trace 32 is connected to the second data line 102. A line width of the first fanout trace 31 is smaller than a line width of the second fanout trace 32. The line width of the first fanout trace 31 and the line width of the second fanout trace 32 are respective radial sizes.

According to the above description, if a height H of fanout area 2 is decreased, the space between the first fanout trace 31 and the adjacent fanout trace 32 will be decreased in a case where the line width of the first fanout trace 31 does not change. In this embodiment of the present disclosure, the line width of the first fanout trace 31 is decreased, and thus a space where the first fanout trace 31 is supposed to be placed then can be released for separating the first fanout trace 31 from its adjacent fanout trace 3. In other words, reducing the line width of the first fanout trace 31 can reduce the height of the fanout area 2 while achieving a required distance between the first fanout trace 31 and the fallout trace 32 adjacent thereto, thereby improving the screen occupancy ratio of the display panel.

The cross-voltage range of the first data line 101 is smaller than the cross-voltage range of the second data line 102, where a minimum value within the cross-voltage range is a minimum driving voltage on the data line 10 and a maximum value within the cross-voltage range is a maximum driving voltage on the data line 10. The larger the cross-voltage range of the signal line is, the longer a signal delay is, and thus the greater the influence on accuracy of transmitted data is. That is, the larger cross-voltage range of the signal line leads to the higher requirement on the signal delay.

In one non-limiting example, the cross-voltage range of the first data line 101 is from 4.46V to 5.96V and the cross-voltage range of the second data line 102 is from 4.2V to 5.96V in this case, switching at a voltage of 1.5V when the first data line 101 is switched from the minimum driving voltage to the maximum driving voltage is sufficient, and switching at a voltage of 1.76V when the second data line 102 is switched from the minimum driving voltage to the maximum driving voltage is sufficient. In a case where a voltage switching rate is constant, a voltage switching time of the first data line 101 is shorter than a voltage switching time of the second data line 102. That is, when voltages on the first data line 101 and the second data line 102 are switched from respective minimum driving voltages to respective maximum driving voltages, at any moment, the voltage on the first data line 101 is closer to a target value while the voltage on the second data line 102 has a larger difference from a target value. That is, a signal delay time on the first data line 101 is shorter than a signal delay time on the second data line 102. For the first data line 101 and the second data line 102, if the line width of the second fanout trace 32 connected to the second data line 102 is decreased, an impedance of the second fanout trace 32 will be increased, which will result in the longer signal delay time on the second data line 102 and thus affect accuracy of a signal transmitted on the second data line 102. Based on this, in this embodiment of the present disclosure, under a premise of reducing a height of the fanout area, in order to reduce the impact on the accuracy of the signal transmitted on the data line 10, a line width of the first fanout trace 31 connected to the first data line 101 is decreased. In this way, the influence on delay of the transmitted signal due to the decreased line width of the first fanout trace 31 then can be reduced (e.g., minimized), thereby achieving normal display of the display panel.

Taking a FHD (Full High Definition) product with a resolution of 108*2160 as an example, when line widths of the first fanout trace 31 and the second fanout trace 32 each are 3.5 um, the height of the fanout area 2 is approximately 2300 um. In this embodiment of the present disclosure, by adjusting the line width of the first fanout trace 31 to be 2.5 um, the height of the fanout area 2 can be decreased to be approximately 1940 um.

As shown in FIG. 3, a driving chip 7 is provided at a side of the fanout area 2 facing away from the display area 1, and an end of the first fanout trace 31 facing away from the display area 1 and an end of the second fanout trace 32 facing away from the display area 1 are connected to the driving chip 7. When the display panel performs displaying, the driving chip 7 provides driving signals to the data lines 10 located in the display area 1 through the fanout trace 3 including the first fanout trace 31 and the second fanout trace 32, so that sub-pixels located in the display area 1 can emit light, thereby enabling the display panel to perform displaying.

As shown in FIG. 3, in the first direction x, a length of the driving chip 7 is equal to a length of a second edge 22 of the fanout area 2, and a length of the display area 1 is equal to a length of a first edge 21 of the fanout area 2.

In an embodiment, a line width d1 of the first fanout trace 31 may satisfy 2 μm≤d1≤3 μm, and a line width d2 of the second fanout trace 32 may satisfy 3 μm≤d2≤5 μm. In this way, the widths of the first fanout trace 31 and the second fanout trace 32 may not be too small while reducing the height of the fanout area 2, thereby achieving accuracy of signals transmitted on the first fanout trace 31 and the second fanout trace 32.

The display area is further provided with a plurality of pixel columns connected to the data lines, and the plurality of pixel columns is arranged in the first direction x and extends in the second direction y. Pixels in the plurality of pixel columns may be arranged in various manners, which will be described in the following.

Figure 4:
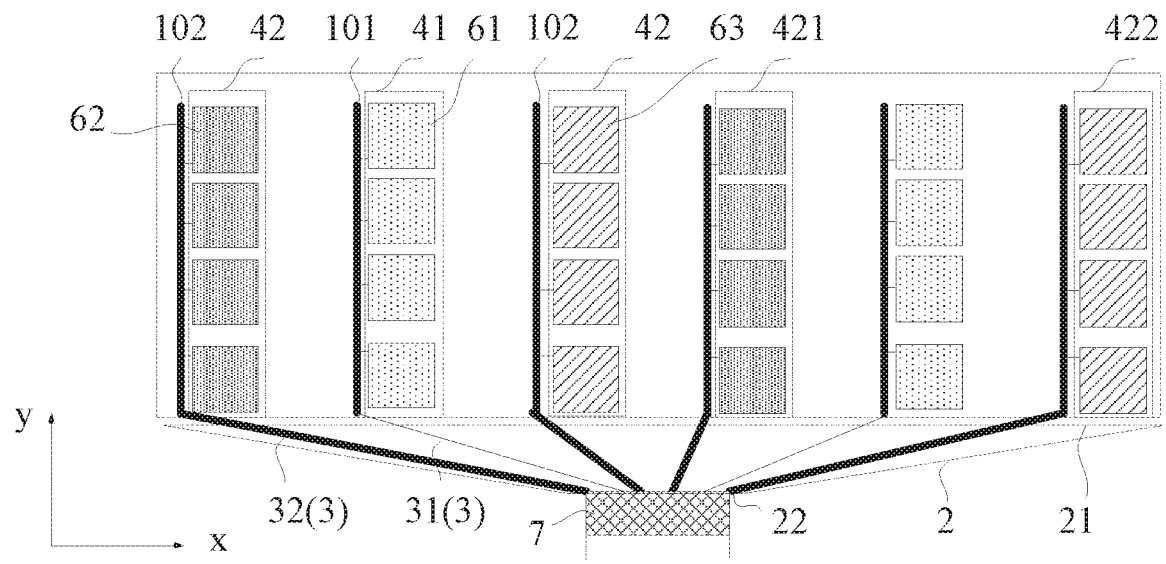
FIG. 4 is a schematic diagram of another display panel according to an embodiment of the present disclosure.

FIG. 4 is a schematic diagram of another display panel according to an embodiment of the present disclosure. As shown in FIG. 4, the plurality of pixel columns 4 includes a first pixel column 41 connected to the first data line 101 and a second pixel column 42 connected to the second data lines 102. The first pixel column 41 includes only sub-pixels 61 having a first color. There are at least one pixel column 42 that includes sub-pixels 62 having a second color and at least one pixel column 42 that includes sub-pixels 63 having a third color.

Alternatively, as shown in FIG. 3, in the display panel shown in FIG. 3, at least one second pixel column 42 includes a sub-pixel 62 having the second color and a sub-pixel 63 having a third color.

When at least one second pixel column 42 includes the sub-pixel 62 having the second color and the sub-pixel 63 having the third color, as shown in FIG. 3, the second pixel column 42 may be set to include a first sub-pixel column 421 and a second sub-pixel column 422. Here, each one of the first sub-pixel column 421 and the second sub-pixel column 422 includes the sub-pixel 62 having the second color and the sub-pixel 63 having the third color that are alternately arranged. Moreover, in the first sub-pixel column 421 and the second sub-pixel column 422, sub-pixels along the first direction x have different colors. For example, taking a first row of sub-pixels shown in FIG. 3 as an example, sub-pixels in the first sub-pixel column 421 are the sub-pixel 62 having the second color, and sub-pixels in the second sub-pixel column 422 are the sub-pixels 63 having the third color.

In an example, when arranging the first sub-pixel column 421 and the second sub-pixel column 422, as shown in FIG. 3, the first sub-pixel column 421, the first pixel column 41, and the second pixel column 422 are sequentially arranged in the first direction x. The arrangement shown in FIG. 3 can be referred to as a Sub-Pixel Rendered (SPR) arrangement. When the display panel performs displaying, two sub-pixels having different colors in the first sub-pixel column 421 or the second sub-pixel column 422 and the sub-pixel 61 having the first color in an adjacent first pixel column 41 can together constitute a pixel unit for displaying. In this embodiment of the present disclosure, while decreasing the height of the fanout area 2, by using the SPR arrangement and matching a corresponding pixel driving algorithm, a sensory resolution can be improved without changing a sub-pixel density and increasing complexity of the process.

Figure 5:
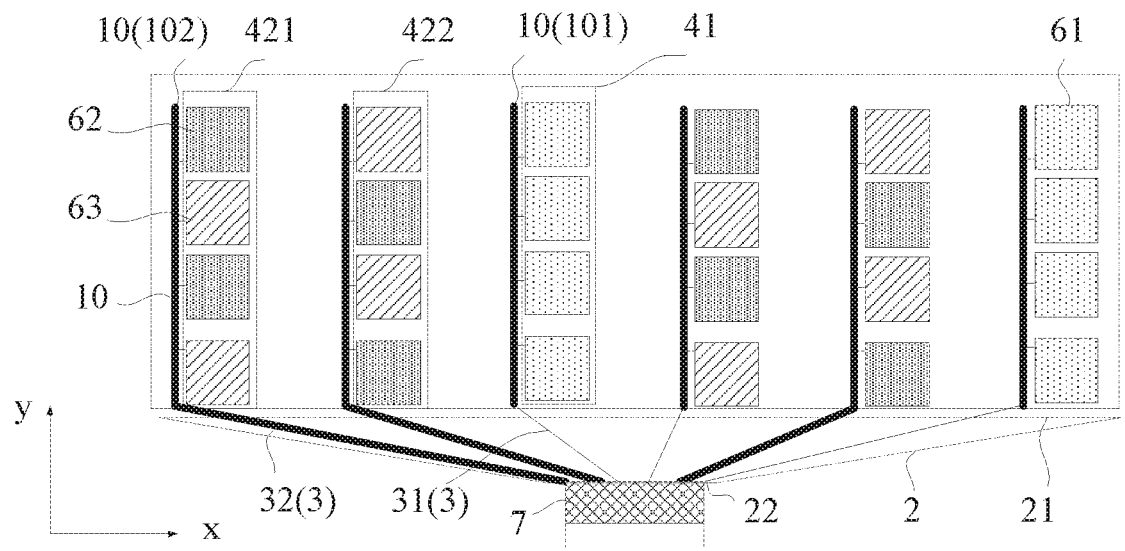
FIG. 5 is a schematic diagram of still another display panel according to an embodiment of the present disclosure.

When arranging the first sub-pixel column 421 and the second sub-pixel column 422, in addition to the arrangement shown in FIG. 3, an embodiment of the present disclosure further provides an arrangement as shown in FIG. 5, which is a schematic diagram of still another display panel according to an embodiment of the present disclosure. As shown in FIG. 5, the first sub-pixel column 421, the second sub-pixel column 422, and the first pixel column 41 are sequentially arranged in the first direction x. When the display panel performs displaying, the sub-pixel 61 having the first color, the sub-pixel 62 having the second color, and the sub-pixel 63 having the third color located in one row can together constitute a pixel unit for displaying.

Since the second pixel column 42 includes the sub-pixel 62 having the second color and the sub-pixel 63 having the third color that are alternately arranged, the minimum value within the cross-voltage range of the second data line 102 is the minimum value within driving voltages of the sub-pixel 62 having the second color and the sub-pixel 63 having the third color, and the maximum value within the cross-voltage range of the second data line 102 is the maximum value within driving voltages of the sub-pixels having the two colors. Compared with the second data line 102, the first pixel column 41 includes only sub-pixels 61 having the first color. In an example, the cross-voltage range of the sub-pixel 61 having the first color is from 4.46V to 5.96V, the cross-voltage range of sub-pixel 62 having the second color is from 4.46V to 5.96V, and the cross-voltage range of the sub-pixel 63 having the third color is from 4.2V to 5.96V In this case, the cross-voltage range of the second data line 102 connected to the sub-pixel 62 having the second color and the sub-pixel 63 having the third color is from 4.2V to 5.96V, and the cross-voltage range of the first data line 101 connected to only the sub-pixel 61 having the first color is from 4.46V to 5.96V Thus, the cross-voltage range of the first data line 101 is smaller, that is, the signal delay time on the first data line 101 is shorter than the signal delay time on the second data line 102. Therefore, in this embodiment of the present disclosure, the line width of the first fanout trace 31 connected to the first data line 101 having a smaller cross-voltage range is decreased, so that the influence on delay of the transmitted signal due to the decreased line width of the first fanout trace 31 then can be minimized, thereby achieving normal display of the display panel.

In addition to the pixel arrangement shown in FIGS. 3 and 5, the display panel can also adopt a pixel arrangement as shown in FIG. 4. As shown in FIG. 4, the second pixel column 42 includes the first sub-pixel column 421 and the second sub-pixel column 422. The first sub-pixel column 421 includes only the sub-pixel having the second color, and the second sub-pixel column 422 includes only the sub-pixel 63 having the third color. The cross-voltage range of the first data line 101 connected to the sub-pixel 61 having the first color is smaller, and thus the signal delay time on the first data line 101 is shorter than that of the second data line 102.

Therefore, in this embodiment of the present disclosure, the line width of the first fanout trace 31 connected to the first data line 101 is decreased, so that the influence on delay of the transmitted signal due to the decreased line width of the first fanout trace 31 then can be minimized, thereby achieving normal display of the display panel.

In an example, the sub-pixel 61 having the first color is a green sub-pixel, the sub-pixel 62 having the second color is a red sub-pixel, and the sub-pixel 63 having the third color is a blue sub-pixel. At present, when a red sub-pixel, a green sub-pixel and a blue sub-pixel are formed by using different organic light-emitting materials, the green organic light-emitting material has a higher luminous efficiency than the red sub-pixel and the blue sub-pixel. Therefore, when the first pixel column 41 is only formed by the green sub-pixels, the cross-voltage range of the first data line 101 connected to the first pixel column 41 is smaller than the cross-voltage range of the second data line 102 connected to the sub-pixel 62 having the second color and the sub-pixel 63 having the third color.

Figure 6:
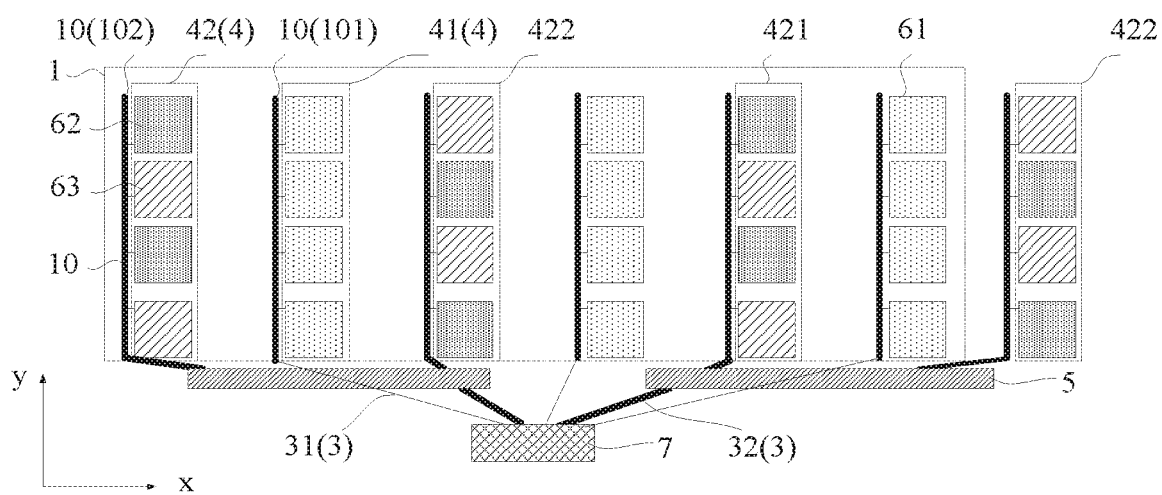
FIG. 6 is a schematic diagram of yet another display panel according to an embodiment of the present disclosure.

FIG. 6 is a schematic diagram of yet another display panel according to an embodiment of the present disclosure. In an example, as shown in FIG. 6, the number of second fanout traces 32 described above may be set to be smaller than the number of second pixel columns 42. Taking FIG. 6 as an example, the number of second fanout traces 32 is two, and the number of second pixel columns 42 is four. This can reduce the number of fanout traces 3, thereby facilitating further reducing the height of the fanout area 2 and improving the screen occupancy ratio of the display panel. Moreover, this can further reduce the number of pins located on the driving chip 7, thereby facilitating reducing a production cost of the driving chip 7.

In an example, as shown in FIG. 6, a plurality of gating units 5 can be further arranged in the display panel. Multiple second data lines 102 are connected to one second fanout trace 32 by the gating unit 5, so as to reduce the number of second fanout traces 32.

In an embodiment of the present disclosure, a plurality of gating units may be further arranged to connect multiple first data lines 101 with one first fanout trace 31. This can further reduce the number of first fanout traces 31 while reducing the line width of the first fanout trace 31, thereby facilitating further reducing the height of the fanout area 2 and increasing the screen occupancy ratio of the display panel.

In an example, the gating unit described above includes a plurality of switches and a plurality of switch control signal lines. First ends of the plurality of switches of a same gating unit are connected to at least two second pixel columns in one-to-one correspondence, second ends of the plurality of switches of a same gating unit are connected to one second fanout trace, and control ends of the plurality of switches of a same gating unit are connected to the switch control signal lines in one-to-one correspondence.

Figure 7:
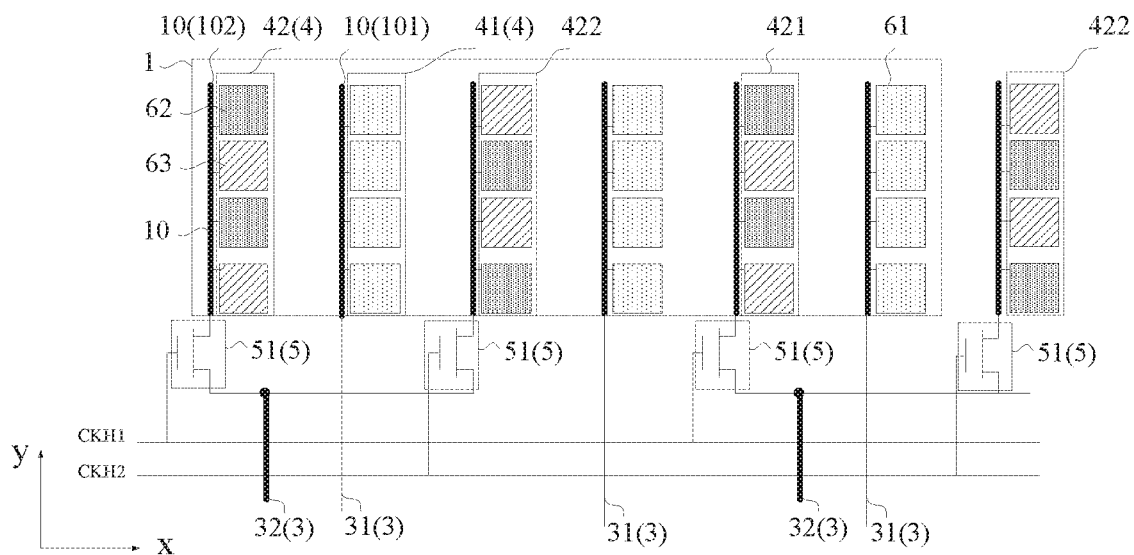
FIG. 7 is a schematic diagram of yet another display panel according to an embodiment of the present disclosure.

FIG. 7 is a schematic diagram of yet another display panel according to an embodiment of the present disclosure. As shown in FIG. 7, in an example, two gating units 5 and two switch control signal lines CKH1 and CKH2 are provided, and each gating unit 5 includes two switches 51. In this case, control ends of first and third switches 51 are connected to the switch control signal line CKH1, control ends of the second and fourth switches 51 are connected to the switch control signal line CKH2, and these four switches 51 are respectively connected to the four second pixel columns 42 in one-to-one correspondence. The first and second switches 51 belong to a same gating unit 5, and second ends of the two switches 51 are connected to a same second fanout trace 32. The third and fourth switches 51 belong to a same gating unit 5, and second ends of the two switches 51 are connected to a same second fanout trace 32.

Figure 8:
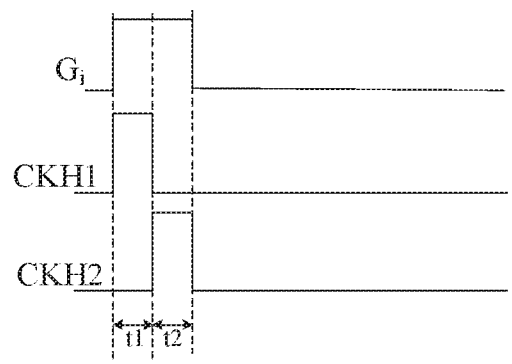
FIG. 8 is a signal time sequence diagram corresponding to FIG. 7.

FIG. 8 is a signal time sequence diagram corresponding to FIG. 7. A method for driving the display panel will be described in the following with reference to FIG. 8.

When the display panel is in operation, during a turn-on time of any one gate line Gi:

in a first period t1, under a control signal outputted from the switch control signal line CKH1, the first and third switches 51 are turned on, so that a signal outputted from the driving chip (not shown in FIG. 7) is transmitted to the second data line 102 connected to the two switches 51 via the second fanout trace 32, that is, the sub-pixel connected to the above-mentioned gate line Gi and a corresponding second data line 102 is charged;

in a second period 2, under a control signal outputted from the switch control signal line CKH2, the second and fourth switches 51 are turned on, so that a signal output by the driving chip (not shown in FIG. 7) is transmitted to the second data line 102 connected to the switches 51 via the second fallout trace 32, that is, the sub-pixel connected to the above-mentioned gate line Gi and a corresponding second data line 102 is charged;

Then, a next row of gate line Gi+1 is scanned, and CKH1 and CKH2 sequentially output control signals in the above-mentioned order until a Whole frame of image is displayed. Then, scanning from the first gate line to the last gate line continues, and during a turn-on time of each gate line, operation continues following the above-mentioned time sequence.

In an example, the above-mentioned switch 51 can be a PMOS transistor or an NMOS transistor. When the PMOS transistor is adopted, the above-mentioned switch control signal line CKH1-CKH2 outputs a low-level signal to control the switch 51 to be turned on; and when the NMOS transistor is adopted, the above-mentioned switch control signal line CKH1-CKH2 outputs a high-level signal to control the switch 51 to be turned on.

It should be understood that the time sequence for outputting control signals from the above-mentioned switch control signal lines CKH1 and CKH2 may not be limited to an order from CKH1 to CKH2, and may also be in an order from CKH2 to CKH1.

Figure 9:
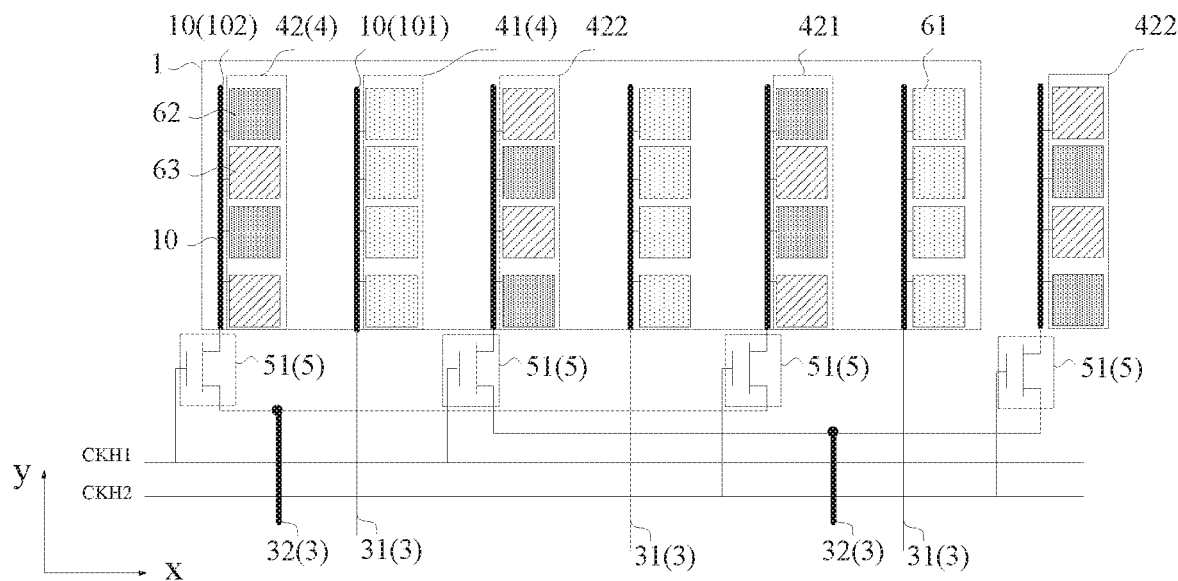
FIG. 9 is a schematic diagram of yet another display panel according to an embodiment of the present disclosure.

In an embodiment of the present disclosure, at least two second pixel columns 42 connected to a same gating unit 5 can have a same pixel arrangement. FIG. 9 is a schematic diagram of yet another display panel according to an embodiment of the present disclosure. As shown in FIG. 9, two first sub-pixel columns 421 are connected to a same gating unit 5, and two second sub-pixel columns 422 are connected to a same gating unit 5. That is, the first and third switches 51 belong to a same gating unit 5, and second ends of the two switches 51 are connected to a same second fanout trace 32; and the second and fourth switches 51 belong to a same gating unit 5, and second ends of the two switches 51 are connected to a same second fanout trace 32. Taking the gating unit 5 connected to two first sub-pixel columns 421 as an example, sub-pixels of a first row are all sub-pixels 62 having the second color. Therefore, when the switch control signal line CKH1 outputs a control signal, the driving chip outputs a signal for causing the sub-pixel 62 having the second color in the first sub-pixel columns 421 located in a first column to emit light. Then, when the switch control signal line CKH2 outputs a control signal, the driving chip outputs a signal for causing the sub-pixel 62 having the second color in the first sub-pixel column 421 located in a second column to emit light without excessively switching the signal outputted from the driving chip. Therefore, a signal transmitted on the second fanout trace 32 does not need to undergo excessively switching either, thereby facilitating reducing power consumption of the display panel.

Figure 10:
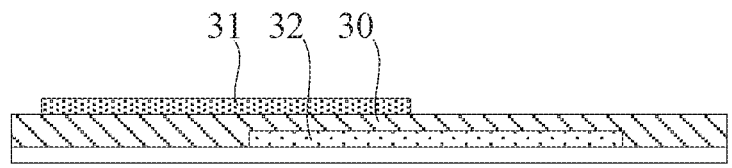
FIG. 10 is a schematic cross-sectional view of an fanout area according to an embodiment of the present disclosure.

In an embodiment of the present disclosure, the first fanout trace 31 and the second fanout trace 32 can be arranged in different metal layers, that is, the first fanout trace 31 and the second fanout trace 32 are formed by patterning different metal layers. FIG. 10 is a schematic cross-sectional view of a fanout area according to an embodiment of the present disclosure. As shown in FIG. 10, when the first fanout trace 31 and the second fanout trace 32 are arranged in different metal layers, an orthographic projection of the first fanout trace 31 and an orthographic projection of the second fanout trace 32 onto an plane of the display panel can be overlapped with each other, thereby reducing space of the fanout area 2 occupied by the first fanout trace 31 and the second fanout trace 32. In an example, as shown in FIG. 10, when the first fanout trace 31 and the second fanout trace 32 are arranged in different metal layers, an insulation layer 30 can be further provided therebetween.

In an embodiment, the display panel further includes a plurality of thin film transistors and storage capacitors, and the thin film transistor includes a gate electrode, a source electrode, and a drain electrode. A part of the fanout traces 3 described above can be arranged in the same layer as the gate electrode of the thin film transistor, and another part of the fanout traces 3 can be arranged in the same layer as one electrode of the storage capacitor, so as to simplify a process thereof.

Figure 11:
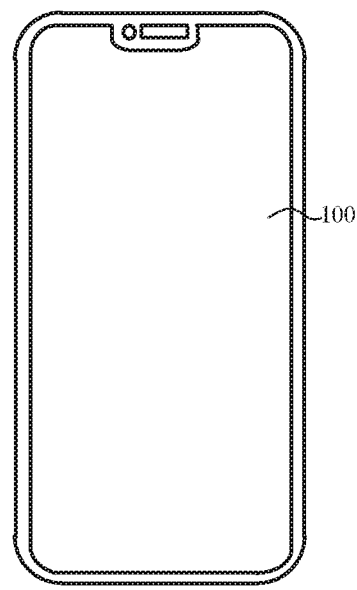
FIG. 11 is a schematic diagram of a display device according to an embodiment of the present disclosure.

An embodiment of the present disclosure further provides a display device. FIG. 11 is a schematic diagram of a display device according to an embodiment of the present disclosure. As shown in FIG. 11, the display device includes the display panel 100 described above. A structure of the display panel 100 has been described in details in the above embodiments, and details will not be further described herein. It should be noted that, the display device shown in FIG. 11 is merely illustrative, and the display device can be any electronic device having a display function, such as a cellphone, a tablet computer, a notebook computer, an electronic paper hook, or a television.

The above-mentioned embodiments are merely preferred embodiments of the present disclosure and are not intended to limit the present disclosure. Any modifications, equivalent substitutions and improvements made within the principle of the present disclosure shall fall into the protection scope of the present disclosure.

What is claimed is:

1. A display panel, the display panel having a display area and a fanout area comprising a first edge close to the display area and a second edge facing away from the display area, the display panel comprising:
    a plurality of data lines located in the display area, the plurality of data lines being arranged in a first direction and extending in a second direction, the plurality of data lines comprising a first data line and a second data line, and a cross-voltage range of the first data line being smaller than a cross-voltage range of the second data line; and
    a plurality of fanout traces located in the fanout area, the plurality of fanout traces comprising at least one first fanout trace and at least one second fanout trace that are located between the first edge and the second edge, and the at least one first fanout trace being connected to the first data line and the at least one second fanout trace being connected to the second data line,
    wherein a length of the first edge is longer than a length of the second edge, the first edge and the second edge are oppositely arranged in the second direction, and a line width d1 of each of the at least one first fanout trace is smaller than a line width d2 of each of the at least one the second fanout trace.

2. The display panel according to claim 1, wherein a minimum value of the cross-voltage range of the first data line and the cross-voltage range of the second data line is a minimum driving voltage on the plurality of data lines, and a maximum value of the cross-voltage range of the first data line and the cross-voltage range of the second data line is a maximum driving voltage on the plurality of date lines.

3. The display panel according to claim 1, wherein the line width d1 of each of the at least one first fanout trace satisfies 2 µm≤d1≤3 µm, and the line width d2 of each of the at least one second fanout trace satisfies 3 µm≤d2≤5 µm.

4. The display panel according to claim 1, wherein a driving chip is provided at a side of the fanout area facing away from the display area, and the at least one first fanout trace and the at least one second fanout trace are connected to the driving chip;
    in the first direction, a length of the driving chip is equal to the length of the second edge of the fanout area, and a length of the display area is equal to the length of the first edge of the fanout area.

5. The display panel according to claim 1, wherein the at least one first fallout trace and the at least one second fallout trace are formed by patterning on different metal layers.

6. The display panel according to claim 5, further comprising a plurality of thin film transistors and a plurality of storage capacitors, each of the plurality of thin film transistors comprises a gate electrode, a source electrode and a drain electrode;
    a part of the plurality of fanout traces is arranged in a same layer as the gate electrode;
    another part of the plurality of fanout traces is arranged in a same layer as one electrode of each of the plurality of storage capacitors.

7. The display panel according to claim 1, further comprising a plurality of pixel columns located in the display area, the plurality of pixel columns being arranged in the first direction and extending in the second direction, wherein the plurality of pixel columns comprises a first pixel column connected to the first data line and more than one second pixel column connected to the second data line, the first pixel column comprises only sub-pixels having a first color, and at least one second pixel column of the more than one second pixel column comprises a sub-pixel having a second color and/or a sub-pixel having a third color.

8. The display panel according to claim 7, wherein each column of the more than one second pixel column comprises a first sub-pixel column and a second sub-pixel column; the first sub-pixel column comprises only the sub-pixel having the second color, and the second sub-pixel column comprises only the sub-pixel having the third color.

9. The display panel according to claim 8, wherein the sub-pixel having the first color is a green sub-pixel, the sub-pixel having the second color is a red sub-pixel, and the sub-pixel having the third color is a blue sub-pixel.

10. The display panel according to claim 7, wherein each column of the more than one second pixel column comprises a first sub-pixel column and a second sub-pixel column, and each column of the first sub-pixel column and the second sub-pixel column comprises the sub-pixel having the second color and the sub-pixel having the third color that are alternately arranged; and sub-pixels in the first sub-pixel column and in the second sub-pixel column in the first direction have different colors.

11. The display panel according to claim 10, wherein the first sub-pixel column, the second sub-pixel column, and the first pixel column are sequentially arranged in the first direction.

12. The display panel according to claim 10, wherein the first sub-pixel column, the first pixel column, and the second sub-pixel column are sequentially arranged in the first direction.

13. The display panel according to claim 7, wherein a number of the at least one second fanout trace is smaller than a number of the more than one second pixel column.

14. The display panel according to claim 13, further comprising a plurality of gating units, each of the plurality of gating units comprising a plurality of switches and a plurality of switch control signal lines; and the plurality of switches of each of the plurality of gating units comprises first ends connected to at least two second pixel columns of the more than one second pixel column in one-to-one correspondence, second ends connected to a same second fanout trace, and control ends connected to the plurality of switch control signal lines in one-to-one correspondence.

15. The display panel according to claim 14, wherein the at least two second pixel columns of the more than one second pixel column are arranged in a same manner.

16. A display device, comprising a display panel, the display panel having a display area and a fanout area comprising a first edge close to the display area and a second edge facing away from the display area, the display panel comprising:

a plurality of data lines located in the display area, the plurality of data lines being arranged in a first direction and extending in a second direction, the plurality of data lines comprising a first data line and a second data line, and a cross-voltage range of the first data line being smaller than a cross-voltage range of the second data line; and a plurality of fanout traces located in the fanout area, the plurality of fanout traces comprising at least one first fanout trace and at least one second fanout trace that are located between the first edge and the second edge, and the at least one first fallout trace being connected to the first data line and the at least one second fanout trace being connected to the second data line, wherein a length of the first edge is longer than a length of the second edge, the first edge and the second edge are oppositely arranged in the second direction, and a line width d1 of each of the at least one first fallout trace is smaller than a line width d2 of each of the at least one the second fanout trace.

* * * * *